(12) United States Patent
Kitayoshi

(10) Patent No.: US 6,249,248 B1
(45) Date of Patent: Jun. 19, 2001

(54) RADIO WAVE VISUALIZING METHOD AND APPARATUS

(75) Inventor: Hitoshi Kitayoshi, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 09/287,660

(22) Filed: Apr. 7, 1999

(30) Foreign Application Priority Data

Apr. 17, 1998 (JP) .................................................. 10-107719

(51) Int. Cl.[7] .................................................. H01Q 3/00
(52) U.S. Cl. .......................................... 342/360; 343/703
(58) Field of Search ............................. 342/360; 343/703

(56) References Cited

U.S. PATENT DOCUMENTS

| | | | |
|---|---|---|---|
| 4,968,983 | * 11/1990 | Maeda | 343/703 |
| 5,410,319 | * 4/1995 | Lopez et al. | 342/360 |
| 5,410,324 | * 4/1995 | Bolomey et al. | 343/703 |
| 5,432,523 | * 7/1995 | Simmers et al. | 343/703 |

OTHER PUBLICATIONS

Tasuku Teshirogi, "Near–Field Antenna Measurement," Shingakusi, vol. 62, No. 10, (Oct. 1979), pgs. 1145–1153.

* cited by examiner

*Primary Examiner*—Theodore M. Blum
(74) *Attorney, Agent, or Firm*—Oblon, Spivak, McClelland, Maier & Neustadt, P.C.

(57) ABSTRACT

An object shape distribution of an antenna intergral-type communication device to be observed with a sensor for measuring a three-dimensional shape is measured and recorded, and a scanning distribution of an interference complex data between a detected signal with a scanning probe antenna measuring a two-dimensional distribution of an electromagnetic wave and a detected signal with a fixed probe antenna, a relative position of which does not change against a measured object, as a two-dimensional electric field distribution or a two-dimensional magnetic field distribution is measured and recorded, based on movement with a predetermined step as a minimum movement unit. The object shape distribution and the two-dimensional electric field distribution or the two-dimensional magnetic field distribution are displayed in a superimposed state on a screen. A line area and a plane area of the antenna integral-type communication device are specified for the display screen. A complex current distribution of the specified line area and plane area is derived from the object shape distribution and the two-dimensional electric field distribution or the two-dimensional magnetic field distribution. Directivity is derived from the object shape distribution and the complex current distribution of the line area or the plane area. The derived directivity is displayed.

7 Claims, 13 Drawing Sheets

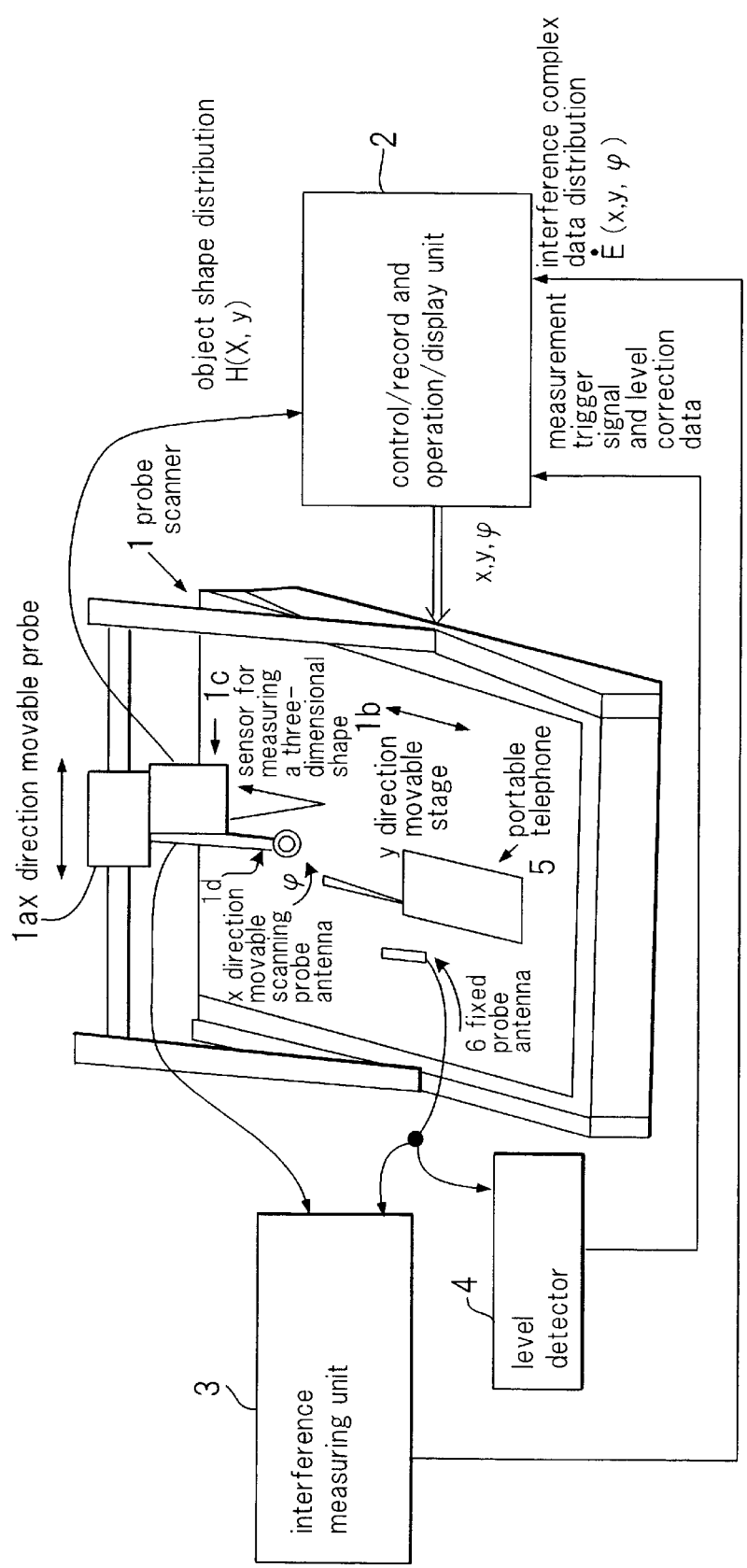

FIG.2

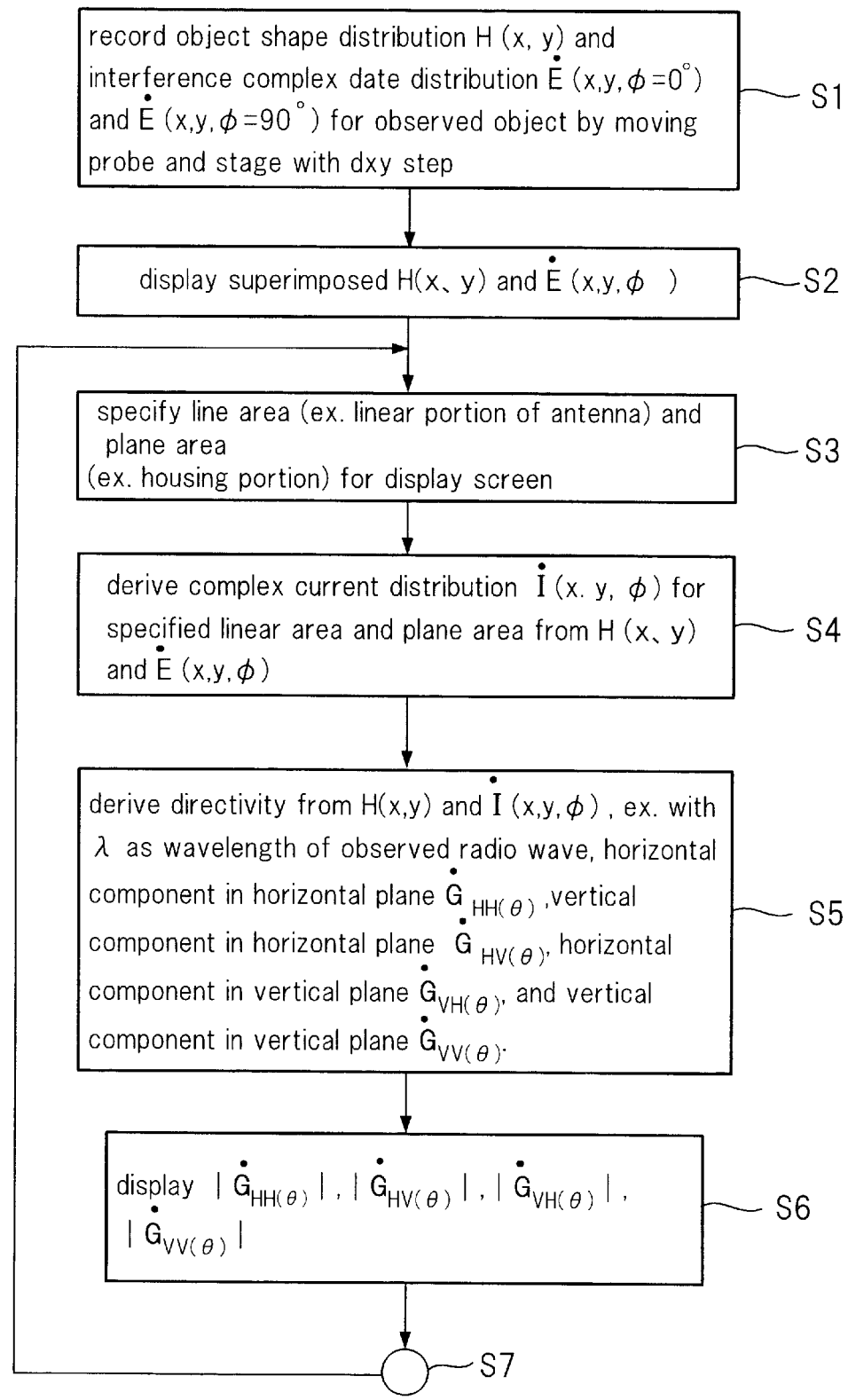

S1: record object shape distribution H (x, y) and interference complex date distribution $\dot{E}$ (x,y,$\phi$=0°) and $\dot{E}$ (x,y,$\phi$=90°) for observed object by moving probe and stage with dxy step S2: display superimposed H(x, y) and $\dot{E}$ (x,y,$\phi$)

S3: specify line area (ex. linear portion of antenna) and plane area (ex. housing portion) for display screen S4: derive complex current distribution $\dot{I}$ (x, y, $\phi$) for specified linear area and plane area from H (x, y) and $\dot{E}$ (x,y,$\phi$)

S5: derive directivity from H(x,y) and $\dot{I}$ (x,y,$\phi$), ex. with $\lambda$ as wavelength of observed radio wave, horizontal component in horizontal plane $\dot{G}_{HH(\theta)}$, vertical component in horizontal plane $\dot{G}_{HV(\theta)}$, horizontal component in vertical plane $\dot{G}_{VH(\theta)}$, and vertical component in vertical plane $\dot{G}_{VV(\theta)}$.

S6: display $|\dot{G}_{HH(\theta)}|$, $|\dot{G}_{HV(\theta)}|$, $|\dot{G}_{VH(\theta)}|$, $|\dot{G}_{VV(\theta)}|$

S7

FIG.3
electromagnetic data three-dimensional view/filter data
$H(X,y)$ and $|\dot{E}(X,y,\psi=0°)|$
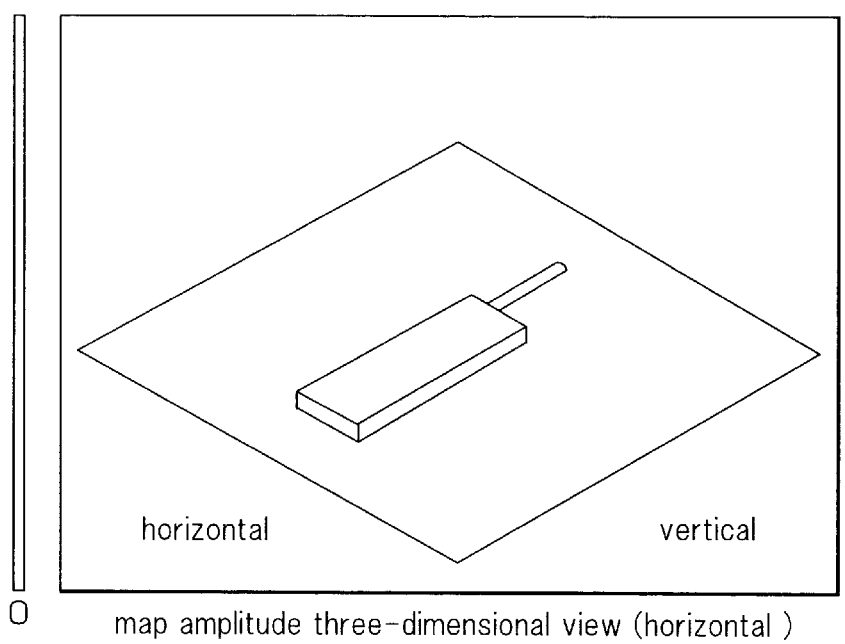
map amplitude three-dimensional view (horizontal)
amplitude·phase graph (horizontal)/filter data $\dot{E}(x,y,\psi=0°)$
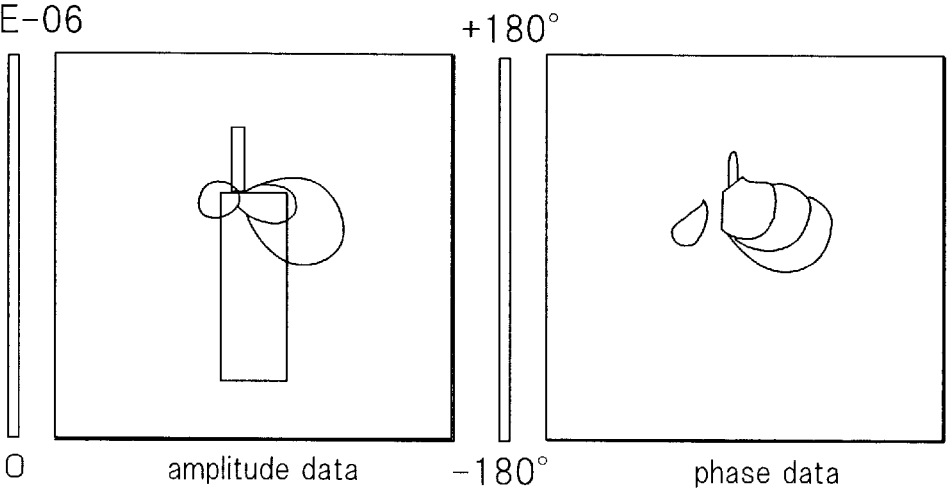
(laser image)
comment: portabl telephone
range : 25.00cm

FIG.4
electromagnetic data three-dimensional view/filter data
$H(X,y)$ and $|\dot{E}(X,y,\psi=90°)|$
7.96E-06
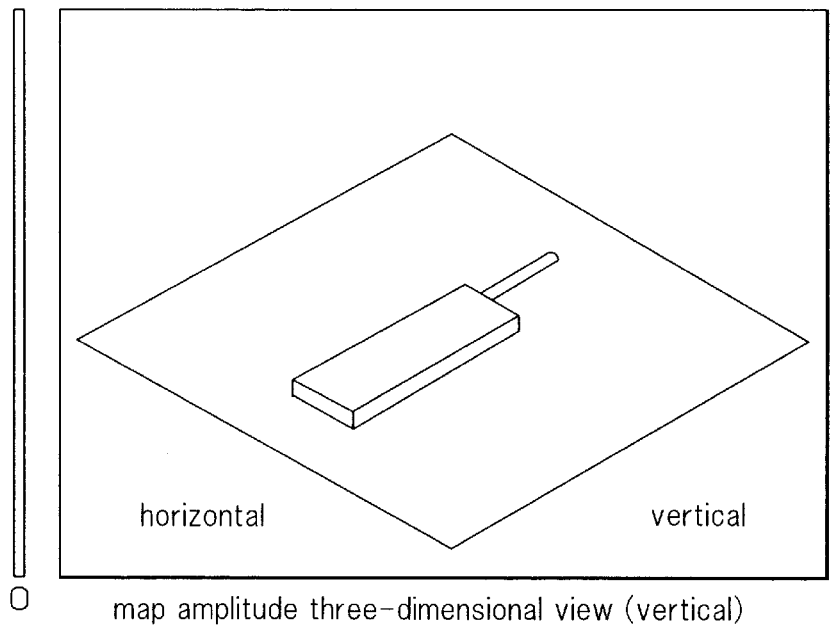
map amplitude three-dimensional view (vertical)
amplitude·phase graph (vertical )/filter data $\dot{E}(x,y,\psi=90°)$
7.96E-06          +180°
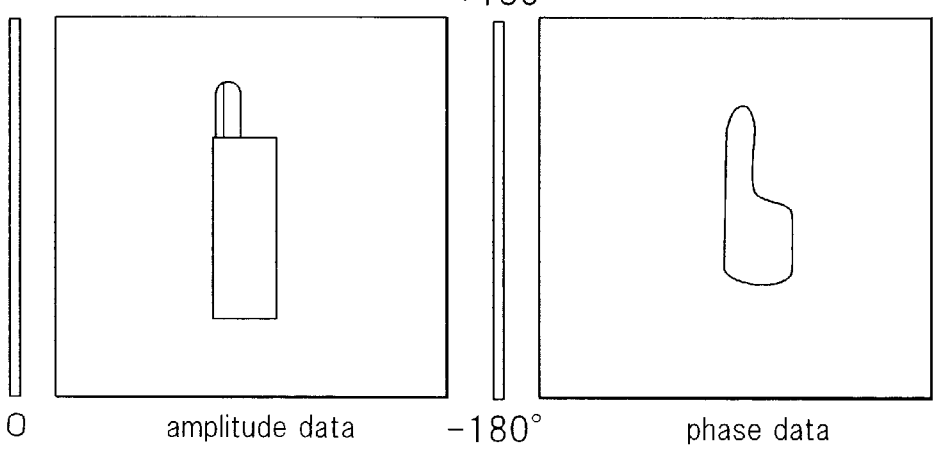
0   amplitude data    -180°   phase data
(laser image)
comment:portabl telephone
range     : 25.00cm amplitude·phase graph (horizontal)/radiation reproduction data (laser image)
comment : portabl telephone
range        : 25.00cm (electromagnetic field data)
probe height            : 1.5cm
reproduction height     : 60.0cm
measurement frequency   : 2000.0MHz
date                    : 97/12/26
time                    : 17:27:55
comment                 : frequency above design amplitude·phase graph (vertical)/radiation reproduction data (laser image)
comment:portabl telephone
range     : 25.00cm (electromagnetic field data)
probe height          :1.5cm
reproduction height   :60.0cm
measurement frequency :2000.0MHz
date                  :97/12/26
time                  :17:27:55
comment               :frequency above design

RADIO WAVE VISUALIZING METHOD AND APPARATUS

BACKGROUND OF THE INVENTION

1. Field of the Invention

The present invention relates to an electromagnetic wave measuring apparatus and a method for evaluating and measuring radiation directivity of an electromagnetic wave using the same.

2. Description of the Related Art

Generally, an electromagnetic wave radiated from an antenna or an electromagnetic wave radiated from a device itself are evaluated for its energy and directivity in a method in which a device to be evaluated is placed using a large anechoic chamber and an electromagnetic wave thereof is received and observed at a sufficiently distant position. The reason for using the RF anechoic chamber is to prevent an electromagnetic wave from entering from the outside and to eliminate an effect of a reflected wave upon the measurement. The reason for performing the measurement at a sufficiently distant position is to measure the radiated electromagnetic wave in the far field and to reduce an error caused by a changed sensitivity due to an effect of the device to be evaluated upon a receiving antenna.

This method, however, involves very large evaluating equipment (for example, 10 m×10 m×10 m in size). Thus, a near field measuring method (Tasuku Teshirogi: "Measurement in Neighborhood Field for Antenna", Shingakusi, vol.62, no.10, pp.1145–1153, October 1979) has been developed as a method for evaluating an antenna. The near field measuring method includes: (a) plane scanning; (b) cylindrical plane scanning; and (c) spherical scanning. The methods (b) and (c) imply the extreme difficulty of accurately measuring the perimeter of a device to be evaluated and involve a large amount of operation required for correction of a probe antenna and for conversion from a near field to a far field, so that these methods have not been brought into practice widely. Thus, the method (a) has been used generally.

However, the above-mentioned conventional, (a) plane scanning method, has a disadvantage that it can be adapted only to an antenna with a relatively narrow directivity such as an aperture antenna. The cause thereof is that the method performs conversion from the near field to the far field on the assumption that a source of an electromagnetic wave is planar.

SUMMARY OF THE INVENTION

It is an object of the present invention to provide an electromagnetic wave measuring apparatus capable of accurately estimating radiation directivity from an antenna having a relatively wide directivity or from an antenna integral-type communication device and a method for evaluating and measuring the radiation directivity of an electromagnetic wave.

The electromagnetic wave measuring apparatus of the present invention comprises a probe scanner movable in the x direction, the y direction, the z direction and a rotating direction; a fixed probe antenna, a relative position of which does not change against a measured object; a control/record and operation/display unit; an interference measuring unit; and a level detector. The probe scanner has a sensor for measuring a three-dimensional shape and a scanning probe antenna measuring a two-dimensional distribution of an electromagnetic wave attached thereto.

A method for evaluating and measuring radiation directivity of an electromagnetic wave with an electromagnetic wave measuring apparatus of the present invention has the steps of: measuring and recording an object shape distribution of an antenna integral-type communication device to be observed with a sensor for measuring a three-dimensional shape, and measuring and recording a scanning distribution of interference complex data between a detected signal with a scanning probe antenna measuring a two-dimensional distribution of an electromagnetic wave and a detected signal with a fixed probe antenna, a relative position of which does not change against a measured object, as a two-dimensional electric field distribution or a two-dimensional magnetic field distribution, based on movement with a predetermined step as a minimum movement unit; displaying the object shape distribution and the two-dimensional electric field distribution or the two-dimensional magnetic field distribution in a superimposed state on a screen; specifying a line area and a plane area of the antenna integral-type communication device for the display screen; deriving a complex current distribution of the specified line area and plane area from the object shape distribution and the two-dimensional electric field distribution or the two-dimensional magnetic field distribution; deriving directivity from the object shape distribution and the complex current distribution of the line area or the plane area; and displaying the derived directivity.

The step of deriving a complex current distribution of the specified line area and plane area from the object shape distribution and the two-dimensional electric field distribution or the two-dimensional magnetic field distribution may include performing predetermined weighting for the specified line area and the plane area.

An electromagnetic wave measuring apparatus of the present invention comprises a probe scanner movable in the x direction, the y direction, the z direction and a rotating direction; a control/record and operation/display unit; and a network analyzer. The probe scanner has a sensor for measuring a three-dimensional shape and a scanning probe antenna measuring a two-dimensional distribution of an electromagnetic wave attached thereto.

A method for evaluating and measuring radiation directivity of an electromagnetic wave with an electromagnetic wave measuring apparatus of the present invention has the steps of: measuring and recording an object shape distribution of an antenna to be observed with a sensor for measuring a three-dimensional shape, and measuring and recording a complex transmission characteristic which is a two-dimensional electric field distribution or a two-dimensional magnetic field distribution by adding an RF output signal of a network analyzer to an antenna to be observed, receiving an electromagnetic wave radiated from the antenna with a scanning probe antenna measuring a two-dimensional distribution of an electromagnetic wave and inputting an RF input of the electromagnetic wave to the network analyzer, based on movement with a predetermined step as a minimum movement unit; displaying the object shape distribution and the complex transmission characteristic in a superimposed state on a screen; specifying a line area of the antenna for the display screen; deriving a complex current distribution of the specified line area from the object shape distribution and the complex transmission characteristic; deriving directivity from the object shape distribution and the complex current distribution of the line area; and displaying the derived directivity.

Therefore, the electromagnetic wave measuring apparatus or the evaluating and measuring method of the electromagnetic wave irradiation directivity with the electromagnetic wave measuring apparatus of the present invention can be used to accurately measure an extreme near field with plane scanning and shape of a device to be evaluated, thereby correctly measuring irradiation directivity from an antenna having a relatively wide directivity or an antenna integral-type communication device.

Additionally, an electromagnetic wave state in an antenna integral-type communication device such as a portable telephone, which heretofore could not be evaluated without using large measuring equipment such as an RF anechoic chamber, can be evaluated using very compact measuring equipment.

BRIEF DESCRIPTION OF THE DRAWINGS

FIG. 1 is a schematic perspective view showing an electromagnetic wave measuring apparatus which serves asa first embodiment of the present invention;

FIG. 2 is a diagram showing a data processing sequence for the electromagnetic measuring apparatus which serves as the first embodiment of the present invention;

FIG. 3 is a diagram which displays an object shape distribution of a portable telephone and an interference complex data distribution which is a two-dimensional field distribution in a superimposed state;

FIG. 4 is a diagram which displays an object shape distribution of the portable telephone and an interference complex data distribution which is a two-dimensional field distribution in a superimposed state;

DETAILED DESCRIPTION OF THE PREFERRED EMBODIMENTS

Figure 5:
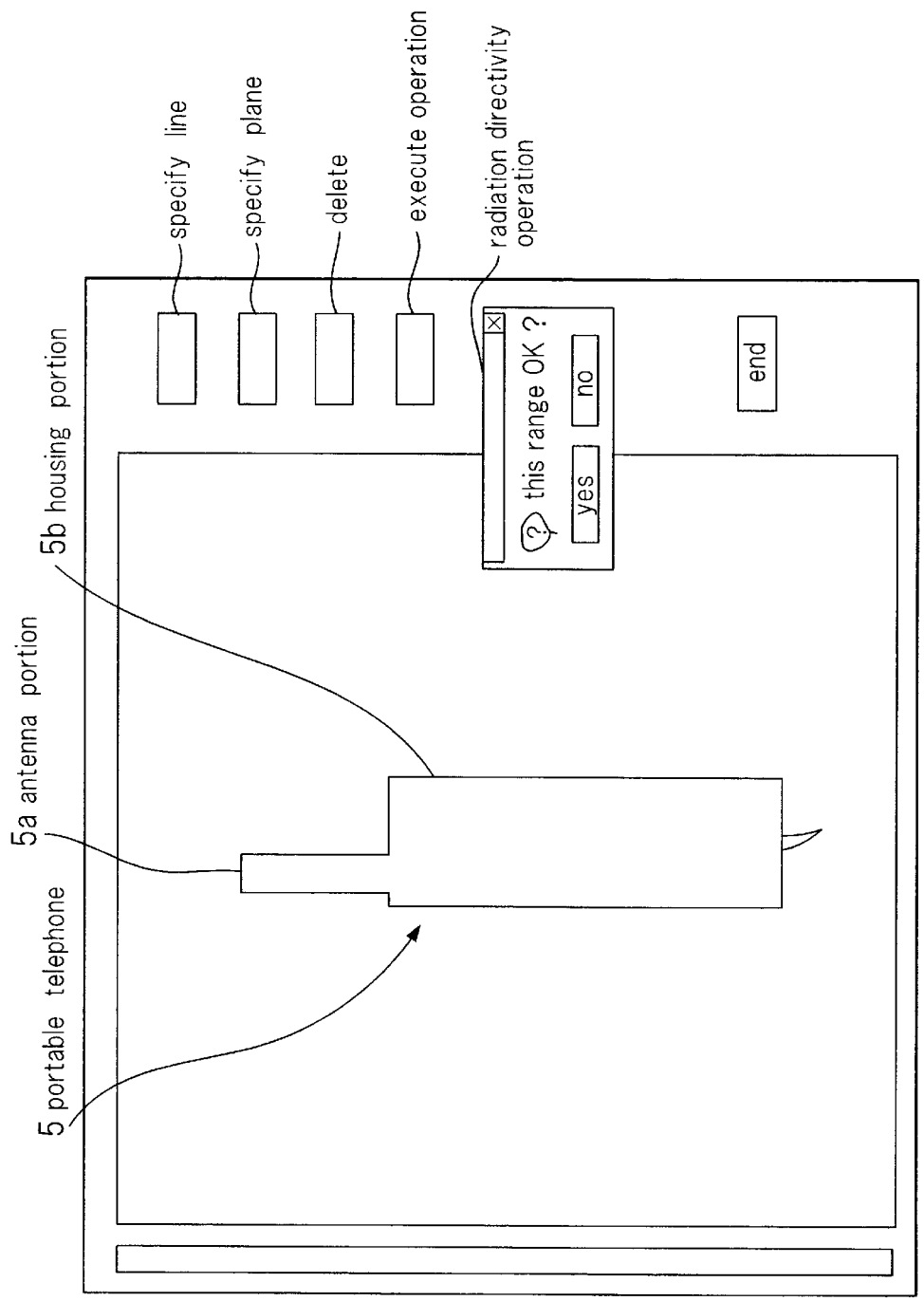
FIG. 5 is a diagram for specifying a line area (for example, a linear portion of the antenna of the portable telephone) and a plane area (for example, a housing portion of the portable telephone) for a display screen.

Embodiments of the present invention will be hereinafter described with reference to accompanying drawings.

(First Embodiment of the Present Invention)

FIG. 1 is a schematic perspective view showing an electromagnetic wave measuring apparatus which serves as a first embodiment of the present invention. The electromagnetic wave measuring apparatus of the first embodiment of the present invention comprises probe scanner 1 having x direction movable probe 1a and y direction movable stage 1b; control/record and operation/display unit 2; interference measuring unit 3; and level detector 4. A sensor for measuring a three-dimensional shape 1c such as a laser displacement meter and x direction movable scanning probe antenna 1d are attached to X direction movable prove 1a. X direction movable scanning probe antenna 1d is rotatable in $\phi$ direction. For interference measuring unit 3, an apparatus disclosed in Japanese Patent Laid-open Publication No.9-133721 may be used.

Next, description will be made on operation of the electromagnetic wave measuring apparatus serving as the first embodiment of the present invention.

First, an antenna integral-type communication device to be observed, for example portable telephone 5, is placed on y direction movable stage 1b in a connecting state.

Next, a fixed probe antenna 6 is placed at a position (on the same y direction movable stage 1b) such that relative positional relationship with portable telephone 5 to be observed is not changed.

Then, x direction movable scanning probe antenna 1d is used to measure an interference complex data distribution which is a two-dimension field distribution (distribution of an electric field or magnetic field) of portable telephone 5 to be observed. Since the field distribution has directivity, it is required to measure the field distribution separately in two directions of $\phi=0°$ and $\phi=90°$, respectively, as expressed by the following equation:

$$\dot{E}(x,y,\phi=0°) \text{ and } \dot{E}(x,y,\phi=90°)$$

In measuring the field distribution, when a transmission power supply repeats ON/OFF over time as in a TDMA mode or the like, level detector 4 is used to synchronize with a measurement timing. When an average level variation occurs, an amplitude in the interference complex data is corrected with an output value of level detector 4.

Simultaneously with, or separately from the above-mentioned field distribution measurement, object shape distribution H (x, y) of portable telephone 5 to be observed is measured using a sensor for measuring a three-dimensional shape 1c such as a laser displacement meter.

Next, description will be made on a data processing sequence for the electromagnetic wave measuring apparatus serving as the first embodiment of the present invention with reference to FIG. 2.

First, x direction movable probe 1a and y direction movable stage 1b are moved with dxy step as a minimum movement unit, thereby measuring and recording (S1) object shape distribution H (x, y) of portable telephone to be observed and the interference complex data distribution which is the two-dimension distribution, expressed by the following equation:

$$\dot{E}(x,y,\phi=0°) \text{ and } \dot{E}(x,y,\phi=90°)$$

Next, the above-mentioned object shape distribution H (x, y) and the interference complex data distribution, expressed by the following equation, are superimposed and displayed (S2) (FIG. 3 and FIG. 4):

$$\dot{E}(x,y,\phi=0°) \text{ and } \dot{E}(x,y,\phi=90°)$$

In FIG. 3 and FIG. 4, minimum movement unit: dxy=3.9 mm
measurement range: 25 cm×25 cm
measurement frequency: f=2 GHz
wavelength of observed radio wave: λ=15 cm and
height of x direction movable scanning probe antenna: h=1.5 cm.

Figure 6:
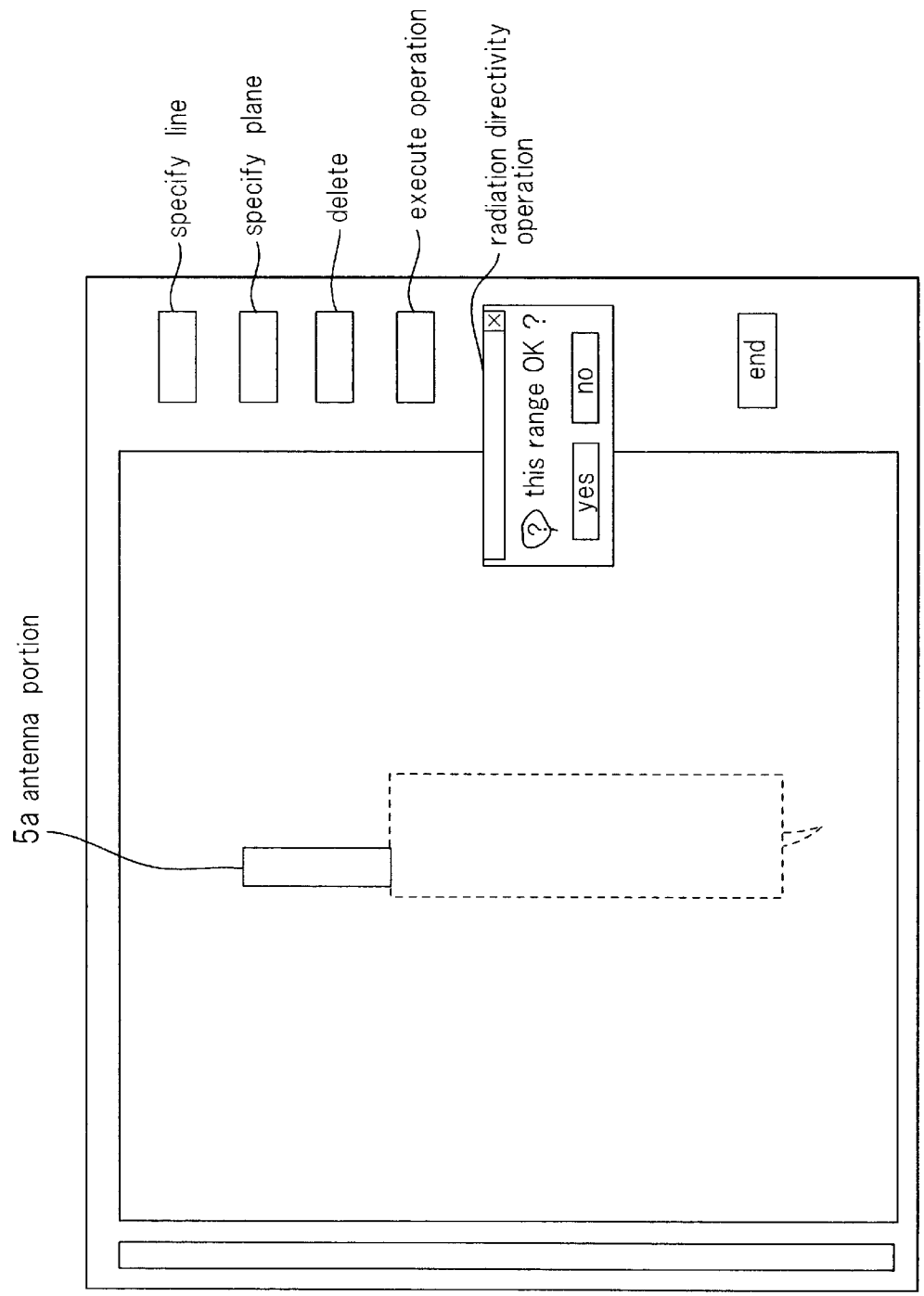
FIG. 6 is a diagram for specifying only the line area(for example, the linear portion of the antenna of the portable telephone) for the display screen.
Figure 7:
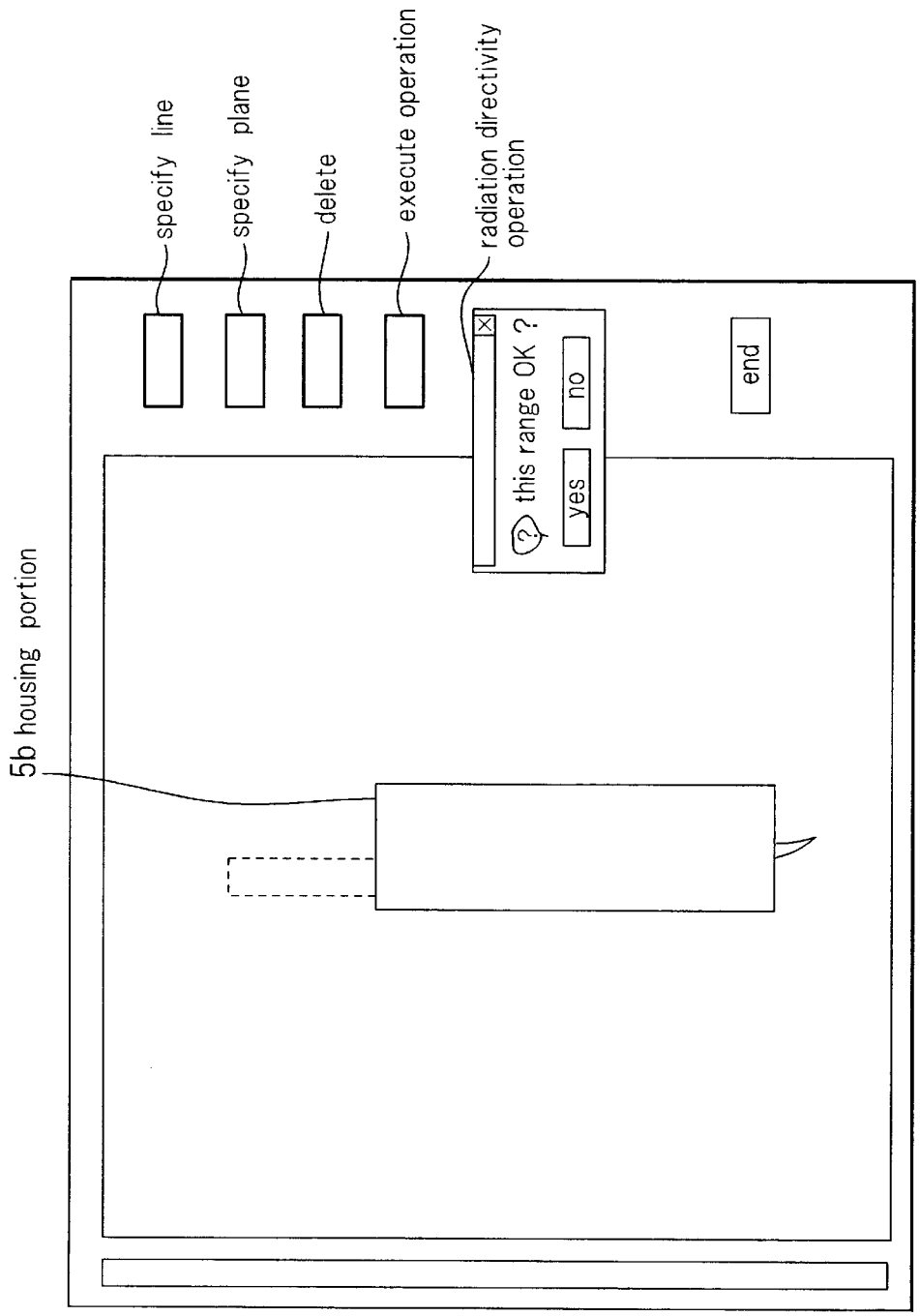
FIG. 7 is a diagram for specifying only the plane area (for example, the housing portion of the portable telephone) for the display screen.

Next, a line area (for example, linear portion of antenna 5a of portable telephone 5) and a plane area (for example, housing portion 5b of portable telephone 5) are specified for a display screen (S3) (FIG. 5 to FIG. 7).

Next, a complex current distribution of the above-mentioned specified line area and the plane area, expressed by the following:

$$\dot{I}(x,y,\phi)$$

is derived (S4) from object shape distribution H (x, y) and the interference complex data distribution expressed by the following:

$$\dot{E}(x,y,\phi)$$

Assuming that the height of x direction movable scanning probe antenna is h, and the sensitivity of the probe antenna at the measurement frequency is g(f), the following operation is performed, for example.

In the line area, the following operation is performed:

$$\dot{I}(x,y,\phi) \cong \dot{E}(x,y,\phi) \cdot d_{xy} \cdot (h-H_{(x,y)})^2 / g_{(f)} \quad (1)$$

In the plane area, the following operation is performed:

$$\dot{I}(x,y,\phi) \cong \dot{E}(x,y,\phi) \cdot (d_{xy})^2 \cdot (h-H_{(x,y)}) / g_{(f)} \quad (2)$$

In an area other than the above-mentioned line area and the plane area, the following is assumed:

$$\dot{I}(x,y,\phi)=0$$

In the above-mentioned (1) equation, $dxy \cdot (h-H(x,y))^2$ represents weighting for the line area. In the above-mentioned (2) equation, $(dxy)^2 \cdot (h-H(x,y))$ represents weighting for the plane area.

Next, directivity is derived (S5) from object shape distribution H (x, y) and the complex current distribution of the line area or the plane area expressed by the following:

$$\dot{I}(x,y,\phi)$$

For example, assuming that λ is a wavelength of the observed radio wave, the following directivity is derived.

directivity of a horizontal component in a horizontal plane:

$$\dot{G}_{HH(\theta)} \cong \left( \sum_x \sum_y \dot{I}_{(x,y,\varphi=0°)} \cdot e^{j2\pi(-x\cdot\sin\theta + H(x,y)\cdot\cos\theta)/\lambda} \right) \cdot \cos\theta$$

directivity of a vertical component in the horizontal plane:

$$\dot{G}_{HV(\theta)} \cong \left( \sum_x \sum_y \dot{I}_{(x,y,\varphi=0°)} \cdot e^{j2\pi(-x\cdot\sin\theta + H(x,y)\cdot\cos\theta)/\lambda} \right)$$

directivity of a horizontal component in a vertical plane:

$$\dot{G}_{VH(\theta)} \cong \left( \sum_x \sum_y \dot{I}_{(x,y,\varphi=0°)} \cdot e^{j2\pi(-y\cdot\sin\theta + H(x,y)\cdot\cos\theta)/\lambda} \right)$$

directivity of a vertical component in the vertical plane:

$$\dot{G}_{VV(\theta)} \cong \left( \sum_x \sum_y \dot{I}_{(x,y,\varphi=0°)} \cdot e^{j2\pi(-x\cdot\sin\theta + H(x,y)\cdot\cos\theta)/\lambda} \right) \cdot \cos\theta$$

Figure 8:
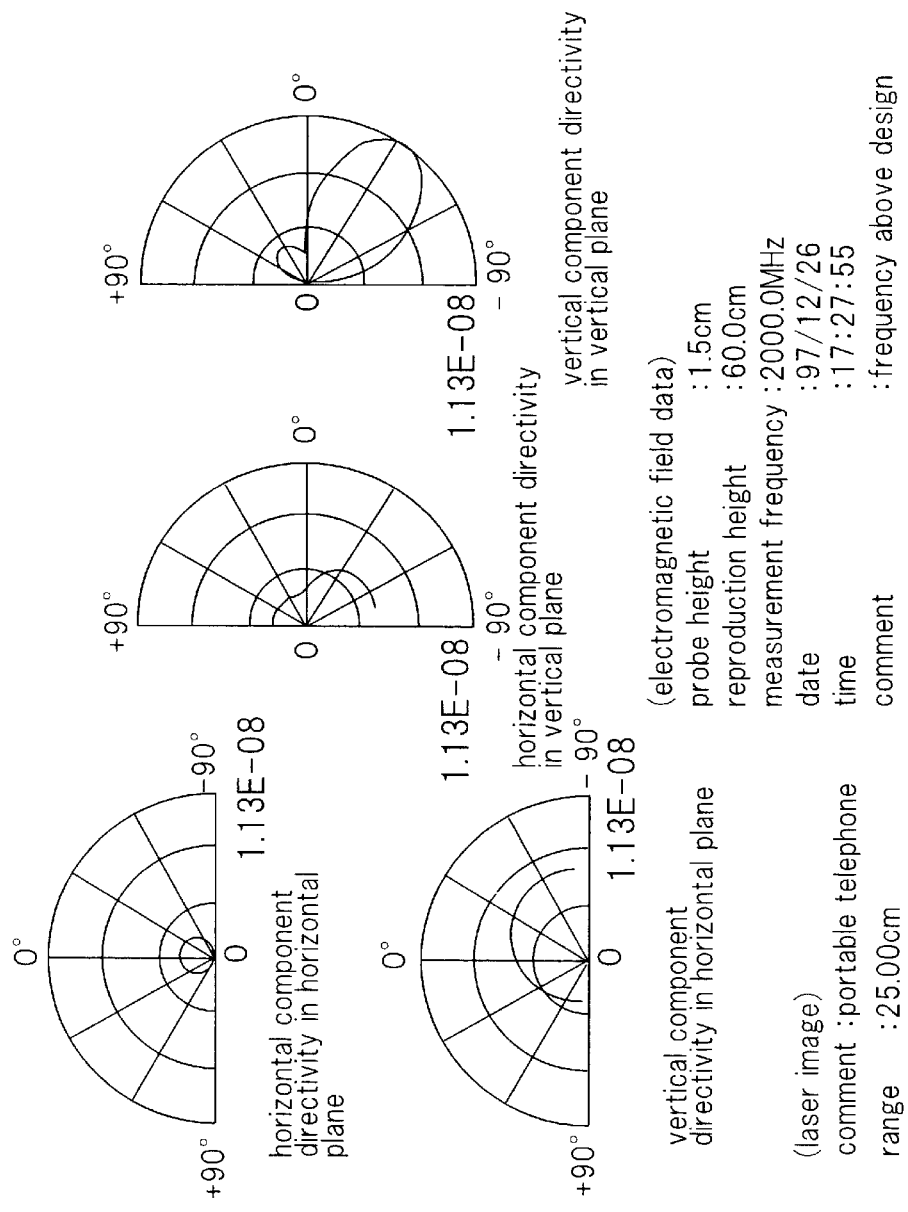
FIG. 8 is a diagram showing a radar chart of radiation directivity when the line area (for example, the linear portion of the antenna of the portable telephone) and the plane area (for example, the housing portion of the portable telephone) are specified for the display screen.
Figure 9:
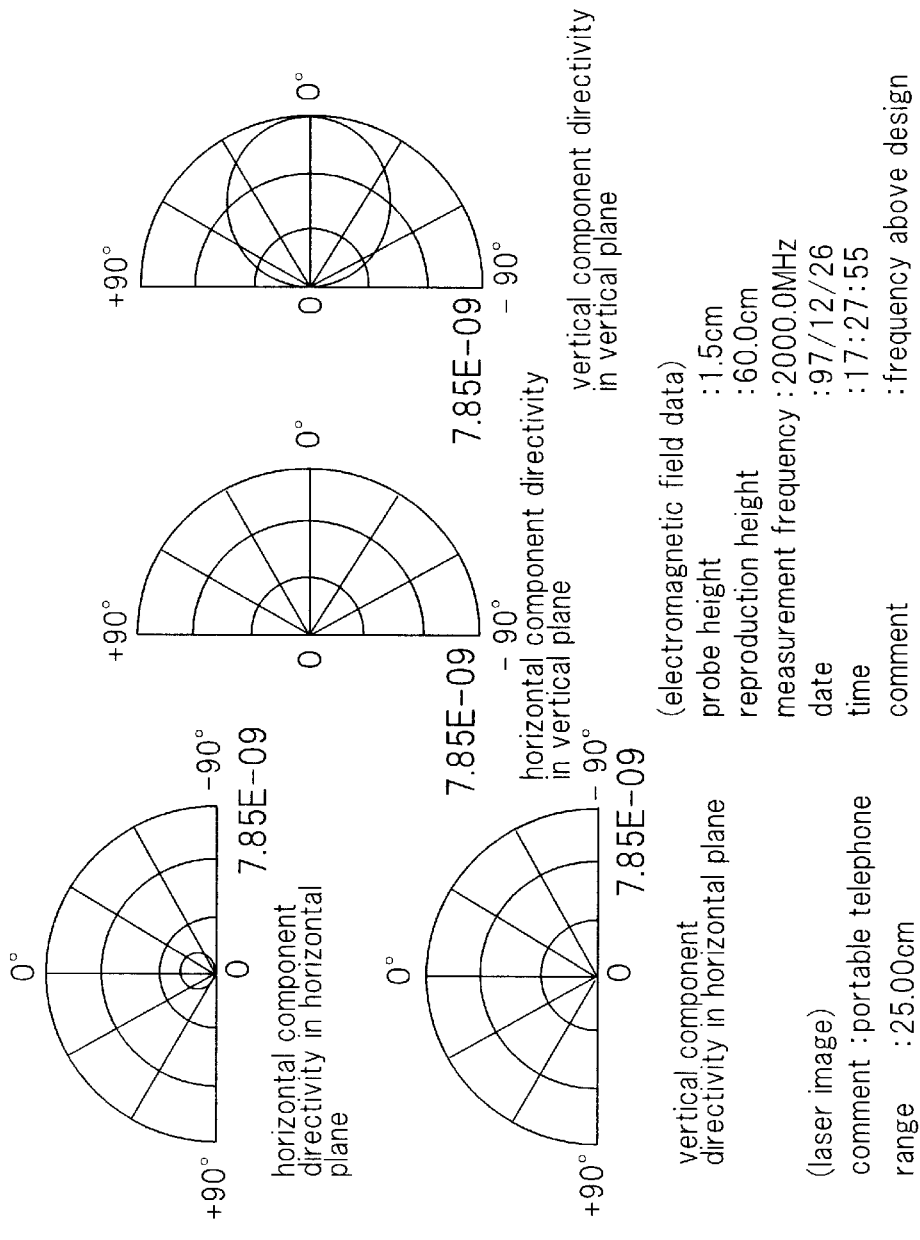
FIG. 9 is a diagram showing a radar chart of radiation directivity when only the line area (for example, the linear portion of antenna of the portable telephone) is specified for the display screen.
Figure 10:
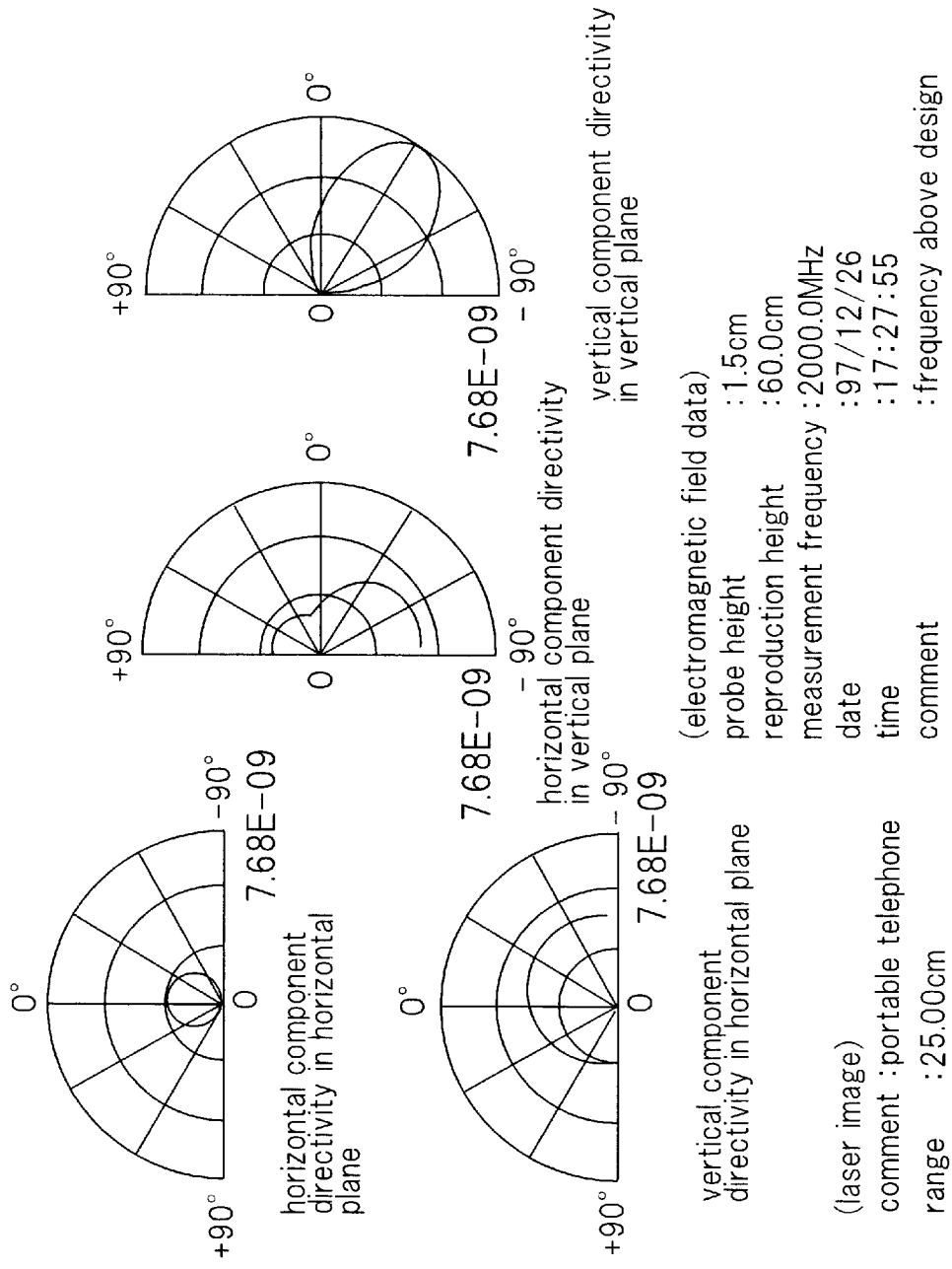
FIG. 10 is a diagram showing a radar chart of radiation directivity when only the plane area (for example, the housing portion of the portable telephone) is specified for the display screen.

Next, the above-mentioned derived directivity for each component, expressed by the following, is displayed (S6) (FIG. 8 to FIG. 10):

$$|\dot{G}_{HH(\theta)}|, |\dot{G}_{HV(\theta)}|, |\dot{G}_{VH(\theta)}|, |\dot{G}_{VV(\theta)}|$$

Next, this procedure returns to S3 (S7) and simulation is made for another combination of a line and plane, for example, when a housing current is absent.

It should be noted that the equations (1), (2) for deriving the complex current distribution of the line area and the plane area at S4, expressed by the following:

$$\dot{I}(x,y,\phi)$$

from object shape distribution H (x, y) and the interference complex data distribution, expressed by the following:

$$\dot{E}(x,y,\phi)$$

are approximate expressions and the accuracy thereof may be increased in the following manner.

Between a current distribution assumed in an arbitrary area, expressed by the following:

$$[\dot{I}_n]$$

and a voltage distribution, expressed by the following:

$$[\dot{V}_n]$$

the following equation holds:

$$[\dot{Z}_{mn}][\dot{I}_n]=[V_m]$$

where the following term:

$$[\dot{Z}_{mn}]$$

represents a mutual impedance between divided current segments (probe antenna or object to be observed) and self-impedance matrix. The following:

$$[\dot{Z}_{mn}]$$

can be derived through an analytical or numerical integration (moment methods: R. F.Harrington, "Field Computation by Moment Methods", IEEE Press, 1993). Thus, it is also possible to derive a correct complex proportion factor between the assumed current distribution area and the probe antenna and use the derived factor.

While S5 shows a case where particular directivity is derived, directivity for an arbitrary direction expressed by the following may be derived:

F

The distribution of a current flowing in arbitrary area V is expressed by the following:

i$_{(\rho)}$ and the directivity with the current can be derived, for a unit direction vector expressed by the following:

F using the following vector effective length:

l$_e$ with the following equation:

$$l_e(F) = F \times \left( \int_v \dot{i}(\rho) e^{j2\pi \rho F/\lambda} dv \right) \times F$$

$$\dot{E}_{(F)} = -\frac{l_2 z_n}{4\pi} \frac{e^{-jhr}}{r} l_{e(F)}$$

Incidentally, k=2π/λ, $Z_0$=120π, r=$(x^2+y^2+z^2)^{1/2}$ and:

F=rF

Figure 11:
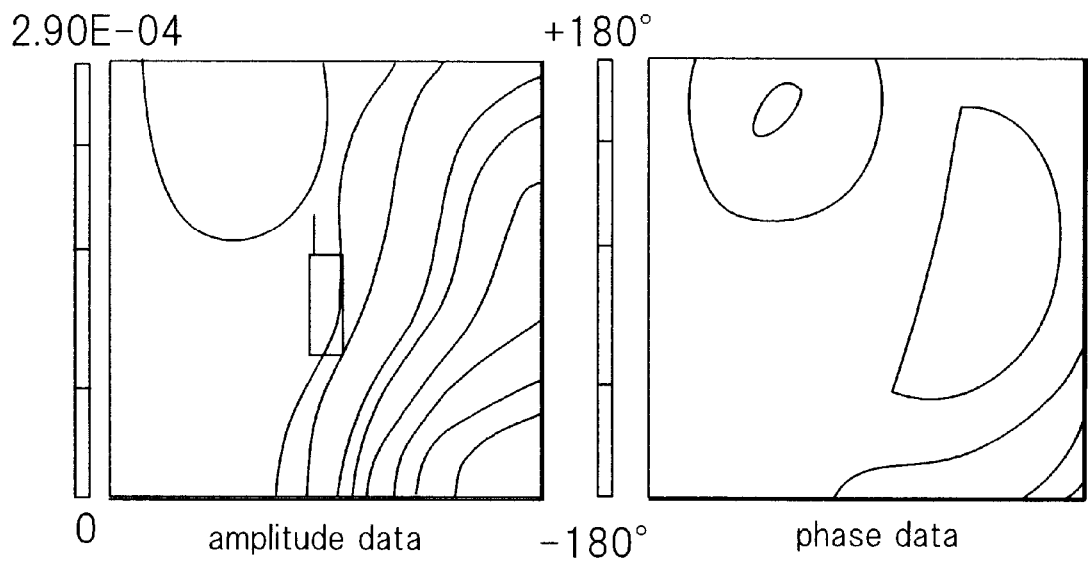
FIG. 11 is a diagram showing a plane distribution of a horizontal component in an electric field at a reproduction height z=60 cm derived from a field distribution measured at a height of x direction movable scanning probe antenna h=1.5 cm.

FIG. 11 shows a plane distribution of a horizontal component in an electric field in a reproduction height: z=60 cm derived from the field distribution measured at the height of x direction movable scanning probe antenna: h=1.5 cm.

Figure 12:
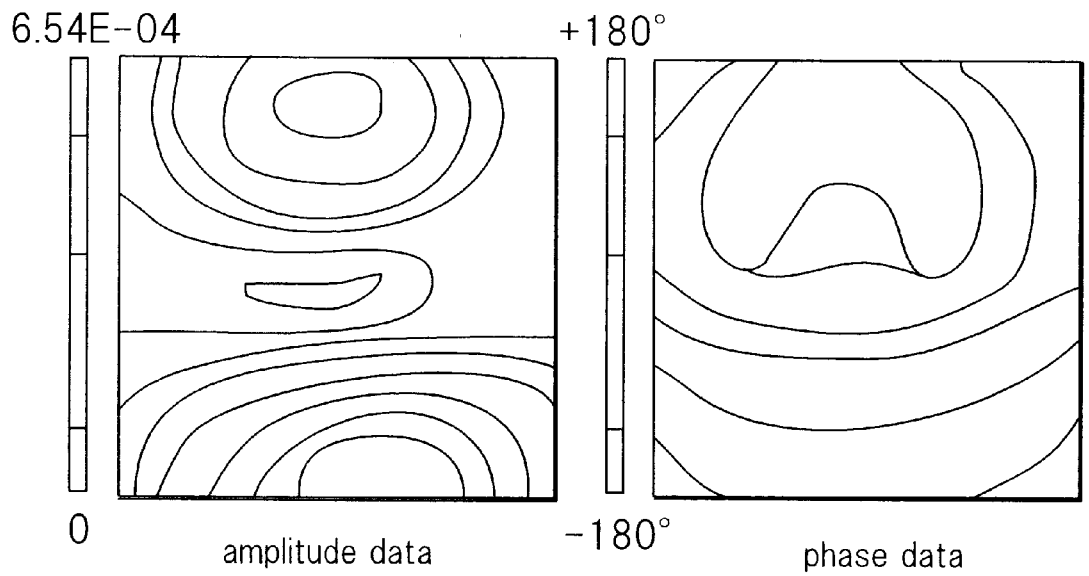
FIG. 12 is a diagram showing a plane distribution of a vertical component in an electric field at a reproduction height z=60 cm derived from a field distribution measured at a height of x direction movable scanning probe antenna h=1.5 cm.

FIG. 12 shows a plane distribution of a vertical component in an electric field in a reproduction height: z=60 cm derived from the field distribution measured at the height of x direction movable scanning probe antenna: h=1.5 cm.

Incidentally, while in the first embodiment of the present invention, probe scanner 1 having x direction movable probe 1a and y direction movable stage 1b is used, the present invention can be implemented with any probe scanner as long as it is movable in the x direction, the y direction, the z direction and a rotating direction.

(Second Embodiment of the Present Invention)

Figure 13:
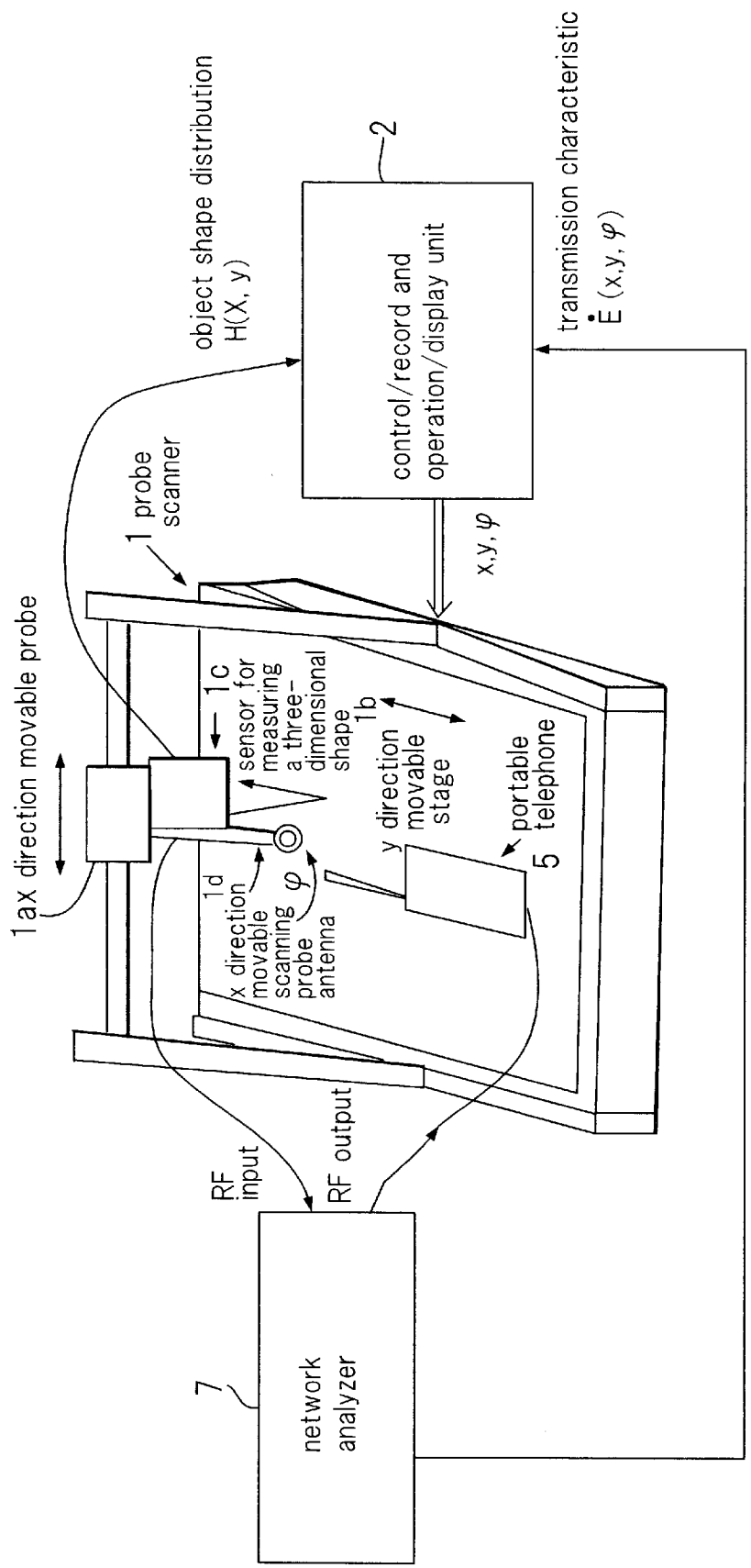
FIG. 13 is a schematic perspective view showing an electromagnetic wave measuring apparatus which serves as a second embodiment of the present invention.

FIG. 13 is a schematic perspective view showing an electromagnetic wave measuring apparatus which serves as a second embodiment of the present invention. The electromagnetic wave measuring apparatus of the second embodiment of the present invention comprises probe scanner 1 having x direction movable probe 1a and y direction movable stage 1b; control/record and operation/display unit 2; and network analyzer 7. A sensor for measuring a three-dimensional shape 1c such as a laser displacement meter and x direction movable probe antenna 1d are attached to X direction movable probe 1a.

If an object to be observed operates with an external input, network analyzer 7 or the like may beused to measure a complex transmission characteristic, expressed by the following, like the antenna shown in FIG. 13 for example:

$\dot{E}_{(x,y,\phi)}$

Incidentally, while in the second embodiment of the present invention, probe scanner 1 having x direction movable probe 1a and y direction movable stage 1b is used, the present invention can be implemented with any probe scanner as long as it is movable in the x direction, the y direction, the z direction and a rotating direction.

As described above, the present invention has the following effects.

A first effect is that the electromagnetic wave measuring apparatus or the evaluating and measuring method of the electromagnetic wave irradiation directivity with the electromagnetic wave measuring apparatus of the present invention can be used to accurately measure an extreme near field with plane scanning and shape of a device to be evaluated, thereby correctly measuring irradiation directivity from an antenna having a relatively wide directivity or an antenna integral-type communication device.

A second effect is that an electromagnetic wave state in an antenna integral-type communication device such as a portable telephone, which could not be evaluated without using large measuring equipment such as an RF anechoic chamber, can be evaluated using very compact measuring equipment.

What is claimed is:

1. An electromagnetic wave measuring apparatus comprising:

a rotatable probe scanner movable in an x direction, a y direction, and a z direction;

a fixed probe antenna, a relative position of which does not change relative to a measured object;

a processor;

an interference measuring unit; and a level detector, wherein;

said probe scanner includes a sensor configured to measure a three-dimensional shape of an object and a scanning probe antenna configured to measure a two-dimensional distribution of an electromagnetic wave, said sensor and scanning probe antenna being attached to said probe scanner;

said processor acquiring information data from said interference measuring unit, said level detector, and said sensor, controlling said probe scanner processing said information data, and displaying said information data;

said interference measuring unit acquiring a first signal detected by said fixed probe antenna and a second signal detected by said scanning probe antenna and outputting an interference complex data distribution of said first and second signals;

said level detector acquiring said first signal from said fixed probe antenna, detecting a level variation of said first signal, and outputting interference complex correction data; and said sensor configured to measure a three-dimensional shape of the measured object using a displacement meter and output an object shape distribution.

2. A method for evaluating and measuring radiation directivity of an electromagnetic wave with an electromagnetic wave measuring apparatus, said method comprising the steps of:

measuring and recording an object shape distribution of an antenna integral communication device to be observed with a sensor configured to measure a three-dimensional shape, and measuring and recording a scanning distribution of an interference complex data between a first signal detected with a scanning probe antenna configured to measure a two-dimensional distribution of an electromagnetic wave and a second signal detected with a fixed probe antenna, a relative position of said fixed probe antenna not changing relative to a measured object, said scanning distribution being one of a two-dimensional electric field distribution and a two-dimensional magnetic field distribution based on a movement of said scanning probe antenna using a predetermined step as a minimum movement unit;

displaying the object shape distribution and one of the two-dimensional electric field distribution and the two-dimensional magnetic field distribution in a superimposed state on a screen;

specifying a line area and a plane area of the antenna integral communication device to the screen;

deriving a complex current distribution of the specified line area and plane area from the object shape distribution and one of the two-dimensional electric field distribution and the two-dimensional magnetic field distribution;

deriving directivity from the object shape distribution end the complex current distribution of the one of line area and the plane area; and displaying the derived directivity.

3. The method for evaluating and measuring radiation directivity of an electromagnetic wave with an electromagnetic wave measuring apparatus according to claim 2, wherein said step of deriving a complex current distribution of the specified line area and plane area from the object shape distribution and one of the two-dimensional electric field distribution and the two-dimensional magnetic field distribution includes weighting, with predetermined weights, the specified line area and the plane area.

4. An electromagnetic wave measuring apparatus comprising:

a rotatable probe scanner movable in an x direction, a y direction, and a z direction;

a processor; and a network analyzer, wherein;

said probe scanner includes a sensor configured to measure a three-dimensional shape of an object and a scanning probe antenna configured to measure a two-dimensional distribution of an electromagnetic wave, said sensor and said scanning probe antenna being attached to said probe scanner;

said processor acquiring transmission characteristic data from said network analyzer and object shape distribution data from said sensor, controlling said probe scanner, processing said information data, and displaying said information data; and said network analyzer acquiring a first RF signal detected by said scanning probe antenna and outputting a second RF signal to said object and the transmission characteristic data of said first and second signals to said processor;

said sensor configured to measure a three-dimensional shape of the object outputting the object shape distribution data to said processor.

5. A method for evaluating and measuring radiation directivity of an electromagnetic wave with an electromagnetic wave measuring apparatus, said method comprising the steps of:

measuring and recording an object shape distribution of an antenna to be evaluated with a sensor configured to measure a three-dimensional shape;

measuring and recording a complex transmission characteristic including one of a two-dimensional electric field distribution and a two-dimensional magnetic field distribution, said measuring and recording including adding an RF output signal of a network analyzer to an antenna to be evaluated, comprising receiving the electromagnetic wave radiated from the antenna to be evaluated with a scanning probe antenna configured to measure a two-dimensional distribution of an electromagnetic wave, and inputting the electromagnetic wave to the network analyzer, based on movement with a predetermined step as a minimum movement unit;

displaying the object shape distribution and the complex transmission characteristic in a superimposed state on a display screen;

specifying a line area of the antenna to be evaluated to the display screen;

deriving a complex current distribution of the specified line area from the object shape distribution and the complex transmission characteristic;

deriving the directivity from the object shape distribution and the complex current distribution of the line area; and displaying the derived directivity.

6. An electromagnetic wave measuring apparatus comprising:

a rotatable probe scanner movable in an x-direction, a y-direction, a z-direction, including a scanning probe antenna configured to measure a two-dimensional distribution of said electromagnetic wave, and a sensor configured to measure a three-dimensional shape of an object and output an object shape distribution to said processor;

a fixed probe antenna, a position of which does not change relative to said object;

an interference measuring unit configured to acquire a first signal detected by said fixed probe antenna and a second signal detected by said scanning probe antenna and output an interference complex data distribution of said first and second signals to a processor;

a level detector configured to acquire said first signal from said fixed probe antenna, detect a level variation of said first signal, and output interference complex correction data to said processor; and said processor configured to receive data from said interference measuring unit, said level detector, and said sensor, control said probe scanner, process said data, and display said processed data.

7. A method of measuring a directivity of a third antenna, comprising:

determining a shape of a device including said third antenna;

measuring electromagnetic irradiation in the near field of said device, said measuring step including affixing a first antenna in a position relative to said device including said third antenna, said first antenna receiving a first signal, and scanning a second antenna that receives a second signal; and calculating the directivity of said third antenna based on said electromagnetic irradiation measured in the near field using the second antenna, including measuring an interference complex data between said first signal and said second signal.

* * * * *